(12) United States Patent
Sprenger et al.

(10) Patent No.: US 10,321,606 B2
(45) Date of Patent: Jun. 11, 2019

(54) FLEXIBLE THERMALLY-CONDUCTIVE SHUNT

(71) Applicant: Intel Corporation, Santa Clara, CA (US)

(72) Inventors: Mark E. Sprenger, Tigard, OR (US); Kenan Arik, Hillsboro, OR (US); Michael S. Brazel, Federal Way, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/471,798

(22) Filed: Mar. 28, 2017

(65) Prior Publication Data

US 2018/0284854 A1    Oct. 4, 2018

(51) Int. Cl.
*H05K 7/20* (2006.01)
*F28F 1/40* (2006.01)
*G06F 1/20* (2006.01)

(52) U.S. Cl.
CPC ......... *H05K 7/20336* (2013.01); *F28F 1/405* (2013.01); *G06F 1/20* (2013.01); *H05K 7/20* (2013.01); *F28F 2255/18* (2013.01); *G06F 2200/201* (2013.01)

(58) Field of Classification Search
CPC ............... G06F 1/20; G06F 1/203; H05K 7/2039–7/20518; F28F 1/405
USPC .................................................. 361/704–723
See application file for complete search history.

(56) References Cited

U.S. PATENT DOCUMENTS

| | | | | |
|---|---|---|---|---|
| 6,508,302 | B2* | 1/2003 | Ishida | B21C 37/151 165/104.21 |
| 6,873,528 | B2* | 3/2005 | Hulan | H05K 7/20545 174/16.3 |
| 9,046,305 | B2* | 6/2015 | Chen | H01L 23/4275 |
| 2010/0051240 | A1* | 3/2010 | Ipposhi | F28D 15/0233 165/104.26 |
| 2018/0122532 | A1* | 5/2018 | Kushima | H01B 5/06 |

* cited by examiner

*Primary Examiner* — Zachary Pape
(74) *Attorney, Agent, or Firm* — Schwabe, Williamson & Wyatt, P.C.

(57) ABSTRACT

Apparatuses, systems and methods associated with a flexible thermally conductive shunt are disclosed herein. The flexible thermally conductive shunt may include a thermally conductive element, the thermally conductive element being flexible. The flexible thermally conductive shunt may further include a thermally conductive member thermally coupled to the thermally conductive element. The thermally conductive member may include a shell and a cavity. The shell may be sealed to the thermally conductive element, wherein the thermally conductive element extends through a discontinuity of the shell. The cavity may be formed at a center of the thermally conductive member and enclosed by the shell, wherein a first portion of the thermally conductive element extends within the cavity and a second portion of the thermally conductive element extends out of the thermally conductive member via the discontinuity of the shell. Other embodiments may be described and/or claimed.

11 Claims, 12 Drawing Sheets

FLEXIBLE THERMALLY-CONDUCTIVE SHUNT

TECHNICAL FIELD

The present disclosure relates to the field of electronic circuits. More particularly, the present disclosure relates to a flexible thermally-conductive shunt for use in electrical systems.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

As technology in electrical systems advance, more components are packed into an area and performance of the components is increased. These advancements result in increased heat being generated within the electrical systems that needs to be conducted out of the electrical systems for proper performance of the components.

An approach to conducting the heat out of the electrical system involves coupling thermally-conductive pucks of a legacy coolant system to heat-generating components within the electrical system, where the legacy coolant systems conducts the heat out of the electrical system via the pucks. However, the legacy coolant systems often utilize structures that are unable to compensate for variations in the heat-generating components that may require changes in the placement of the thermally-conductive pucks. Further, the structures may wear and fail due to vibration of the thermally-conductive pucks that may occur during operation and/or movement of the electrical systems.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
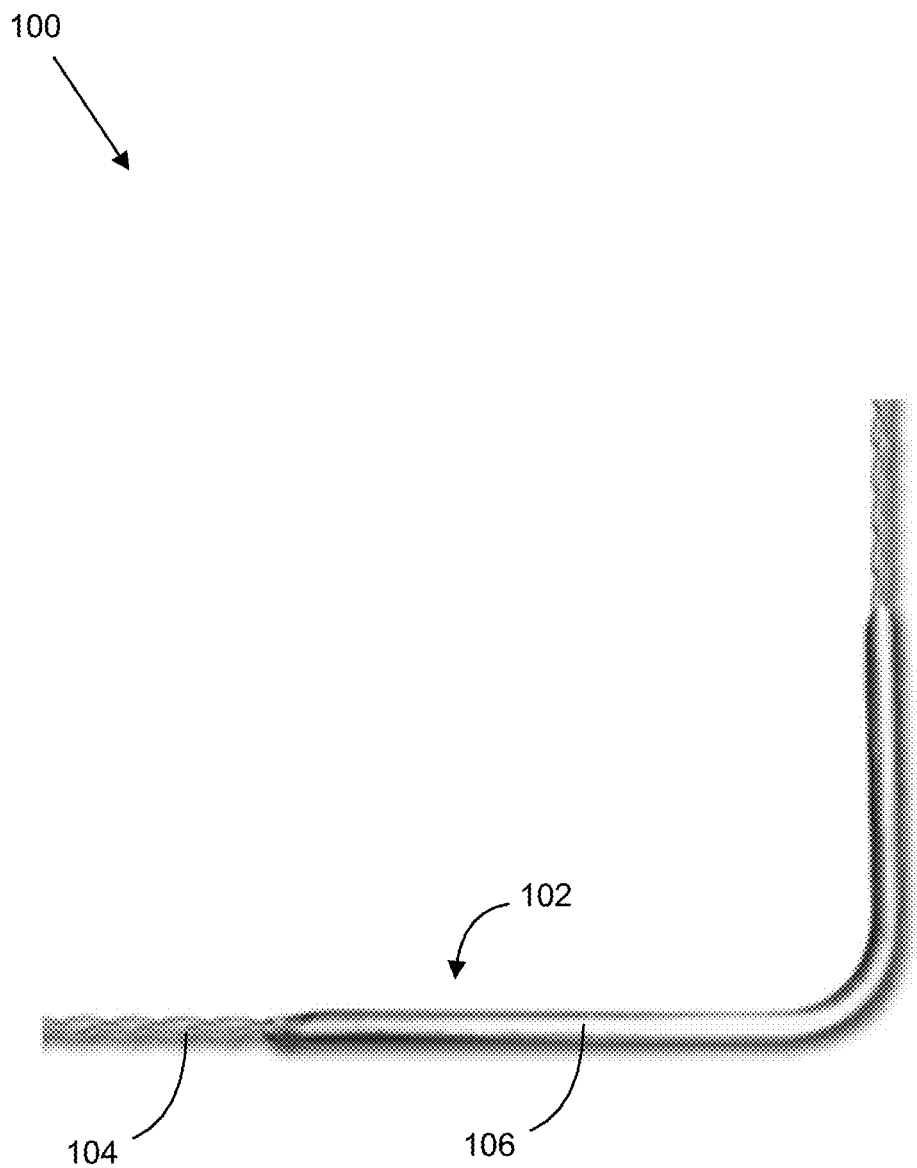
FIG. 1 illustrates an example flexible thermally-conductive shunt, according to various embodiments.

Apparatuses, systems and methods associated with a flexible thermally-conductive shunt are disclosed herein. The flexible thermally-conductive shunt may include a thermally-conductive element, the thermally-conductive element being flexible. The flexible thermally-conductive shunt may further include a thermally-conductive member thermally coupled to the thermally-conductive element. The thermally-conductive member may include a shell and a cavity. The shell may be sealed to the thermally-conductive element, wherein the thermally-conductive element extends through a discontinuity of the shell. The cavity may be formed at a center of the thermally-conductive member and enclosed by the shell, wherein a first portion of the thermally-conductive element extends within the cavity and a second portion of the thermally-conductive element extends out of the thermally-conductive member via the discontinuity of the shell. Other embodiments may be described and/or claimed.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates an example flexible thermally-conductive shunt 100, according to various embodiments. The thermally-conductive shunt 100 may include a thermally-conductive element 104. The thermally-conductive element 104 may be a flexible element, such as wire, flexible metal, thermally-conductive ribbon, or some combination thereof. In embodiments where the thermally-conductive element 104 is wire, the wire may be a straight wire, braided wire, wicked wire, spiral wire, twisted wire, or some combination thereof. The thermally-conductive element 104 may be formed of a thermally-conductive material, such as copper, titanium, nickel, Monel, aluminum, beryllium, iron, gold, nickel, silver, tin, alloys including any of the previously listed materials, or some combination thereof.

The flexible thermally-conductive shunt 100 may further include a thermally-conductive member 102. The thermally-conductive member 102 may include a shell 106 that encloses a cavity within the thermally-conductive member 102. The shell 106 may have a round cross-section, an oval cross-section, a rectangular cross-section, a geometric cross-section, or some combination thereof. The shell 106 may be formed of a thermally-conductive material, such as copper, titanium, nickel, Monel, aluminum, beryllium, iron, gold, nickel, silver, tin, steel, alloys including any of the previously listed materials, or some combination thereof. While the thermally-conductive member 102 is illustrated with a 90-degree bend, it is to be understood that the thermally-conductive member 102 may be any shape, including being straight.

The shell 106 may be sealed to the thermally-conductive element 104 at both ends of the thermally-conductive member 102. Portions of the thermally-conductive element 104 may extend within the cavity from a first end of the shell 106 to a second end of the shell 106, outside of the thermally-conductive member 102 from the first end of the shell 106, outside of the thermally-conductive member 102 from the second end of the shell 106, or some combination thereof. The portions of the thermally-conductive element 104 that extend outside of the thermally-conductive member 102 may not be sintered. The portion of the thermally-conductive element 104 that extends within the cavity may be at least partially sintered. The portion of the thermally-conductive element 104 may be sintered with iron, carbon, copper, nickel, steel, alloys including any of the previously listed materials, or some combination thereof. In some embodiments, the portion of the thermally-conductive element 104 that extends within the cavity may not be sintered. Further, in some embodiments, the portions of the thermally-conductive element 104 that extend outside the thermally-conductive member 102 may be insulated, or at least partially insulated.

The thermally-conductive member 102 may be formed from a thermally-conductive tube, such as a heat pipe. The thermally-conductive tube may include a shell that encircles a hollow center portion with openings at both ends of the tube. The thermally-conductive member 102 may be formed by sealing the openings at both ends of the thermally-conductive tube. Each of the openings may be sealed to a corresponding cross-section of the thermally-conductive element 104. A first opening at one end of the tube may be sealed to a first corresponding cross-section of the thermally-conductive element 104 and the second opening at the opposite end of the tube may be sealed to a second corresponding cross-section of the thermally-conductive element 104.

Sealing the openings may include brazing, swaging, applying solder to, applying epoxy to, or some combination thereof, the openings to the thermally-conductive member 102 and/or the corresponding cross-sections of the thermally-conductive element 104. The openings, when sealed, may be air tight against the thermally-conductive element 104, such that air and/or liquid cannot pass through the sealed openings. The sealed openings may each have a discontinuity between the portions of the shell of the thermally-conductive member 102; however, the thermally-conductive element 104 passes through the discontinuities and maintains the air tightness of the thermally-conductive member 102. In particular, the discontinuities may be an opening relative to the shell 106 of the thermally-conductive member 102. However, the thermally-conductive element 104 may pass through the opening in the shell 106 and the shell 106 may be sealed (via the brazing, swaging, applying solder to, applying epoxy to, or some combination thereof) to the thermally-conductive element 104 with the shell 106 being sealed airtight, at the opening, to the thermally-conductive element 104 due to the sealing. Sealing the openings may enclose the hollow center portion of the tube within the shell, thereby forming a cavity formed at a center of the thermally-conductive member 102.

While the thermally-conductive member 102 is described as being formed from a thermally-conductive tube, it is to be understood that this procedure may be performed in some of the embodiments. In other embodiments, the thermally-conductive member 102 may be formed in different manners and from different structures that will result in the same limitations of having the shell 106 and the cavity formed at the center of the thermally-conductive member 102.

The flexible thermally-conductive shunt 100 may further include a thermally-conductive liquid located within the cavity formed in the thermally-conductive member 102. The liquid may at least partially fill the cavity and may be in contact with the portion of the thermally-conductive element 104 that extends within the cavity. The liquid may include water, oil, glycol, deionized water, mercury, or some combination thereof. The chemical makeup of the liquid be selected based on the chemical makeup of the shell 106, the thermally-conductive element 104, or some combination thereof. The liquid may be enclosed within the cavity by the shell 106 and/or the thermally-conductive element 104, such that the liquid may not leave the cavity. In some embodiments, the thermally-conductive liquid may be omitted from the flexible thermally-conductive shunt 100.

Further, in some embodiments, the flexible thermally-conductive shunt 100 may include a thermally-conductive gas located within the cavity in lieu of or in addition to the thermally-conductive liquid being located within the cavity. The gas may include air, carbon oxide, hydrogen, helium, neon, compressed oxygen, or some combination thereof.

The gas may fill the cavity or fill a portion of the cavity not filled by the thermally-conductive liquid. In some embodiments, the thermally-conductive gas may be omitted from the flexible thermally-conductive shunt 100.

Figure 2:
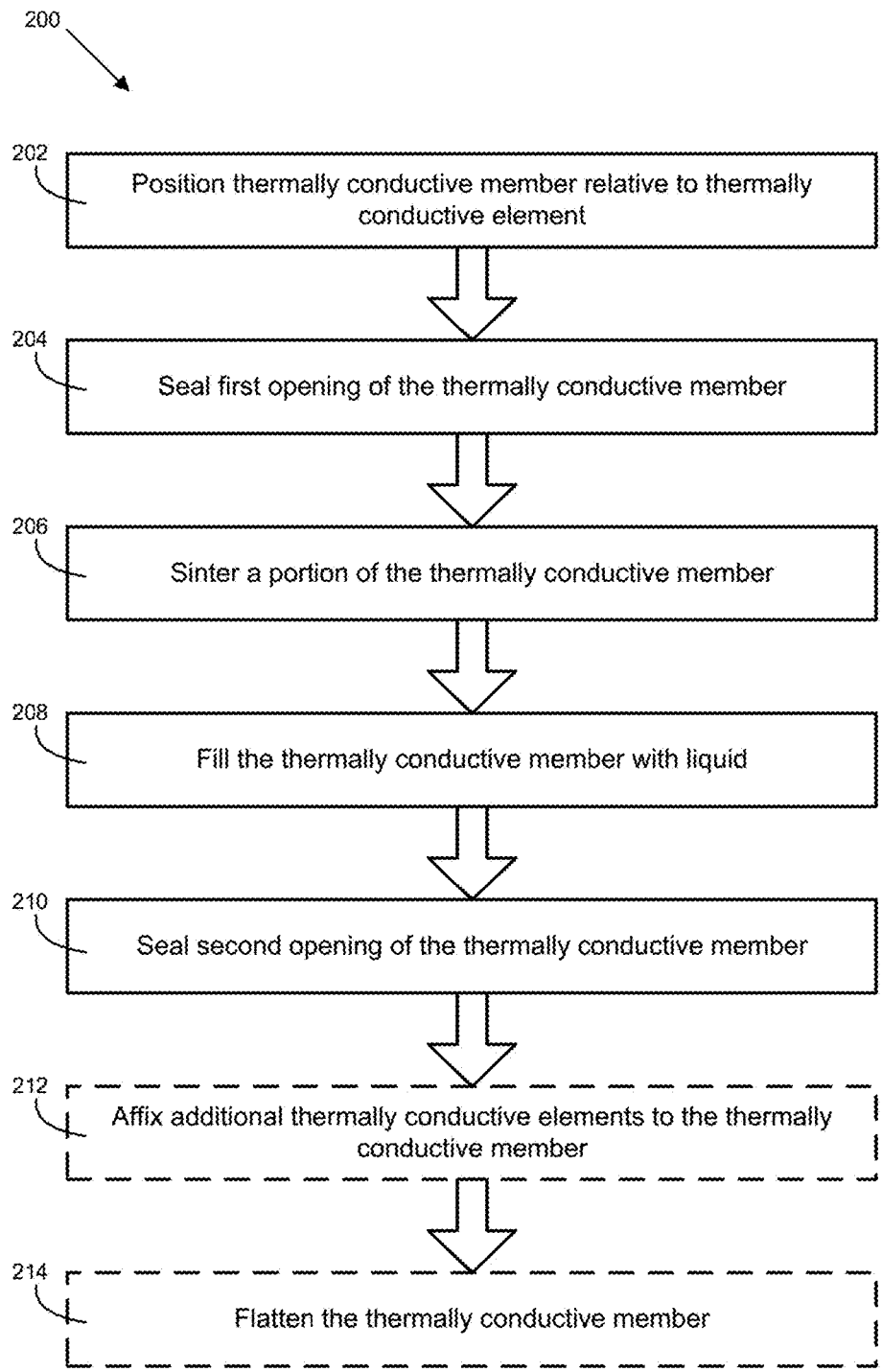
FIG. 2 illustrates an example procedure of producing a flexible thermally-conductive shunt, according to various embodiments.

FIG. 2 illustrates an example procedure 200 of producing a flexible thermally-conductive shunt, according to various embodiments. The flexible thermally-conductive shunt may include one or more of the features of the flexible thermally-conductive shunt 100 (FIG. 1). The procedure 200 may include the procedure of forming the thermally-conductive member 102 (FIG. 1) from a thermally-conductive tube as mentioned in relation to FIG. 1. The procedure 200 is illustrated in conjunction with FIG. 3 through FIG. 7, which are referred to in the description of the procedure 200 below.

In stage 202 (illustrated in FIG. 3), a thermally-conductive member 302 may be positioned relative to a thermally-conductive element 304. The thermally-conductive member 302 may include one or more of the features of the thermally-conductive member 102 (FIG. 1) and the thermally-conductive element 304 may include one or more of the features of the thermally-conductive element 104 (FIG. 1).

The thermally-conductive member 302 may include a tube-shaped shell 306 with a hollow center 308 encircled by the shell 306. The shell 306 may include a first opening 310 at a first end 314 of the shell 306 and a second opening 312 at a second end 316 of the shell 306, the first opening 310 and the second opening 312 coupled to the hollow center 308. In some embodiments, the thermally-conductive member 302 may be a heat pipe. Note that the tube-shaped shell 306 is transparently illustrated to show other features that would be obstructed by the shell 306.

Positioning the thermally-conductive member 302 relative to the thermally-conductive element 304 may include routing the thermally-conductive element 304 through the hollow center 308 of the thermally-conductive member 302. The thermally-conductive element 304 may extend out of the thermally-conductive member 302 via the first opening 310, the second opening 312, or some combination thereof. Accordingly, a first portion of the thermally-conductive element 304 may extend within the hollow center 308, a second portion of the thermally-conductive element 304 may extend out of the thermally-conductive member 302 via the first opening 310, and a third portion of the thermally-conductive element 304 may extend out of the thermally-conductive member 302 via the second opening 312. In some embodiments, an end of the thermally-conductive element 304 may be aligned with the first opening 310 or the second opening 312, such that the thermally-conductive 304 extends out of the thermally-conductive member 302 through only one of the first opening 310 and the second opening 312.

In stage 204 (illustrated in FIG. 4), the first opening 310 (FIG. 3) of the thermally-conductive member 302 may be sealed to the thermally-conductive element 304. The first opening 310 may sealed to a first cross-section of the thermally-conductive element 304. Sealing the first opening 310 to the thermally-conductive element 304 may include brazing, swaging, applying solder to, applying epoxy to, or some combination thereof, the first opening 310 and/or the thermally-conductive element 304. Sealing the first opening 310 may cause the first end 314 to be sealed airtight to the thermally-conductive element 304, such that air and/or liquid cannot pass through the first end 314. Further, sealing the first opening 310 may leave a first discontinuity 402 in the shell 306 at the first end 314, wherein the thermally-conductive element 304 may pass through the first discontinuity 402. The thermally-conductive element 304, solder, epoxy, material applied via brazing, or some combination thereof may fill the first discontinuity 402, such that the first discontinuity 402 is sealed airtight.

In stage 206 (illustrated in FIG. 5), a portion of the thermally-conductive element 304 may be sintered. The portion of the thermally-conductive element 304 that is sintered may be the portion of the thermally-conductive element 304 that extends within the hollow center 308 of the thermally-conductive member 302, or at least some portion thereof. The portions of the thermally-conductive element 304 that extend outside of the thermally-conductive member 302 may remain not sintered.

Sintering the portion of the thermally-conductive element 304 may include filling at least a portion of the hollow center 308 with a sintering material 502. The sintering material 502 may include metal powder, such as iron powder, carbon powder, copper powder, nickel powder, steel powder, powder alloys of the previously listed materials, or some combination thereof. The thermally-conductive member 302 may be oriented in a vertical direction with the first end 314 pointed to the ground, such that gravity maintains the sintering material 502 within the hollow center 308. Heat may be applied to the sintering material 502 causing the sintering material 502 to be sintered to the portion of the thermally-conductive element 304 within the hollow center 308, to inner walls of the shell 306, or some combination thereof. In some embodiments, 206 may be omitted and, accordingly, the portion of the thermally-conductive element 304 and the shell 306 may remain not sintered.

In stage 208 (illustrated in FIG. 6), the thermally-conductive member 302 may be at least partially filled with liquid 602. The liquid 602 may include one or more of the features of the liquid described in relation to FIG. 1. Filling the thermally-conductive member 302 with the liquid 602 may include at least partially filling the hollow center 308 with the liquid 602. The thermally-conductive member 302 may be oriented in a vertical direction with the first end 314 pointed to the ground, such that gravity maintains the liquid 602 within the hollow center 308.

In some embodiments, the thermally-conductive member 302 may be at least partially filled with gas in lieu of or in addition to the liquid 602. The gas may include one or more of the features of the gas described in relation to FIG. 1. Filling the thermally-conductive member 302 with the gas may include partially filling the hollow center 308 with the gas, filling the hollow center 308 with the gas, filling the portion of the hollow center 308 that is not filled by the liquid 602 with the gas, or some combination thereof. Further, in some embodiments, 208 may be omitted, such that the thermally-conductive member 302 is not filled with the liquid 602 nor filled with the gas.

In stage 210 (illustrated in FIG. 7), the second opening 312 (FIG. 3) of the thermally-conductive member 302 may be sealed to the thermally-conductive element 304. The second opening 312 may sealed to a second cross section of the thermally-conductive element 304. Sealing the second opening 312 to the thermally-conductive element 304 may include brazing, swaging, applying solder to, applying epoxy to, or some combination thereof, the second opening 312 and/or the thermally-conductive element 304. Sealing the second opening 312 may cause the second end 316 to be sealed airtight to the thermally-conductive element 304, such that air and/or liquid cannot pass through the second end 316. Further, sealing the second opening 312 may leave a second discontinuity 702 in the shell 306 at the second end 316, wherein the thermally-conductive element 304 may pass through the second discontinuity 702. The thermally-conductive element 304, solder, epoxy, material applied via brazing, or some combination thereof may fill the second discontinuity 702, such that the second discontinuity 702 is sealed airtight.

Sealing the second opening 312 may enclose the hollow center 308 (FIG. 3) within the shell 306. Accordingly, enclosing the hollow center 308 may form a cavity 704 at a center of the thermally-conductive member 302, the cavity 704 enclosed by the shell 306. In embodiments where the portion of the thermally-conductive element 304 within the hollow center had been sintered, the sintered portion of the thermally-conductive element 304 may be within the cavity 704 when the second opening 312 is sealed.

Accordingly, the first portion of the thermally-conductive element 304 may extend within the cavity 308 and may, in some embodiments, be sintered. Further, the second portion of the thermally-conductive element 304 may extend out of the thermally-conductive member 302 through the first discontinuity 402 and may not be sintered, and the third portion of the thermally-conductive element 304 may extend out of the thermally-conductive member 302 through the second discontinuity 702 and may not be sintered. In some embodiments where the first end 314 and/or second end 316 is aligned with an end or ends of the thermally-conductive elements 304, the second portion of the thermally-conductive element 304 and/or the third portion of the thermally-conductive element 304 that extend outside of the thermally-conductive member 302 may be omitted.

In some embodiments where stage 208 was performed, the liquid 602 and/or the gas may be enclosed within the cavity 704 when the second opening 312 is sealed. In some embodiments where stage 208 was omitted, the cavity 704 may be filled with air or may be in a vacuum condition when the second opening 312 is sealed.

Figure 8:
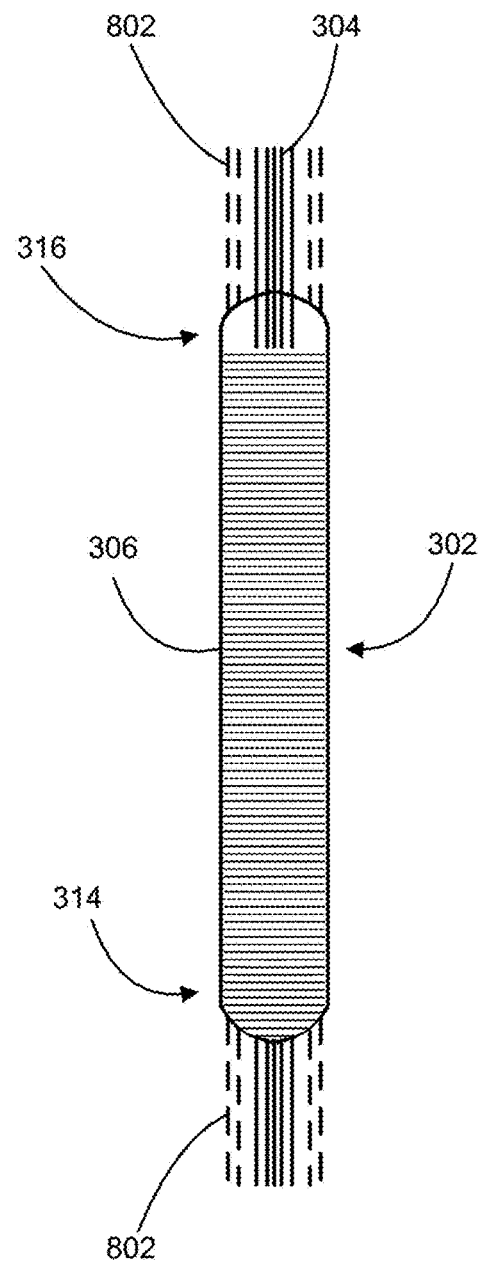
FIG. 8 illustrates an example of the flexible thermally-conductive shunt at stage 212 of the example procedure of FIG. 2, according to various embodiments.

In stage 212 (illustrated in FIG. 8), one or more additional thermally-conductive elements 802 (illustrated in dashed lines to differentiate from the thermally-conductive element 304) may be coupled to an exterior of the thermally-conductive member 302. The additional thermally-conductive elements 802 may include one or more of the features of the thermally-conductive element 304. The additional thermally-conductive elements 802 may be coupled to shell 306 via solder, epoxy, brazing, or some combination thereof. The additional thermally-conductive elements 802 may be coupled to the first end 314 of the shell 306, the second end 316 of the shell 306, or both ends of the shell 306. The additional thermally-conductive elements 802 may be separate from the thermally-conductive element 304, interspersed with the thermally-conductive element 304, weaved together with the thermally-conductive element 304, or some combination thereof. In some embodiments, the stage 212 may be omitted and, therefore, the additional thermally-conductive elements 802 may be omitted.

Further, in some embodiments, the thermally-conductive element 304 may be omitted and only the additional thermally-conductive elements 802 may be coupled to the thermally-conductive member 302. In these embodiments, the ends of the thermally-conductive member 302 may be sealed and the additional thermally-conductive elements 802 may be coupled to the exterior of the sealed ends of the thermally-conductive member 302 and/or other portions of the thermally-conductive member 302.

In stage 214, the thermally-conductive member 302 may be flattened, or otherwise reshaped. Flattening, or otherwise reshaping the thermally-conductive member 302 may include applying force to the shell 306, or some portion thereof. The shell 306, or the portion thereof, may be flattened, reshaped, or some combination thereof. In some embodiments, stage 214 may be omitted.

In alternate embodiments, some of the operations of procedure 200 may be combined, divided, omitted, or performed in different orders.

Figure 9:
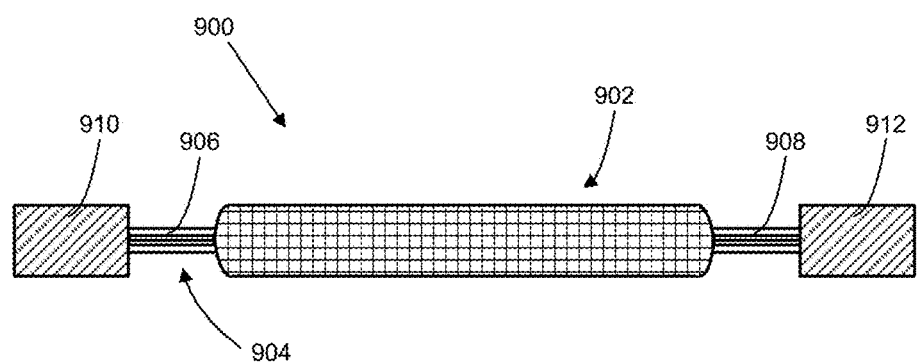
FIG. 9 illustrates an example of a flexible thermally-conductive shunt coupled to cold blocks, according to various embodiments.

FIG. 9 illustrates an example of a flexible thermally-conductive shunt 900 coupled to cold blocks, according to various embodiments. The flexible thermally-conductive shunt 900 may include one or more of the features of the flexible thermally-conductive shunt 100 (FIG. 1), the flexible thermally-conductive shunt produced by procedure 200 (FIG. 2), or some combination thereof.

Figure 3:
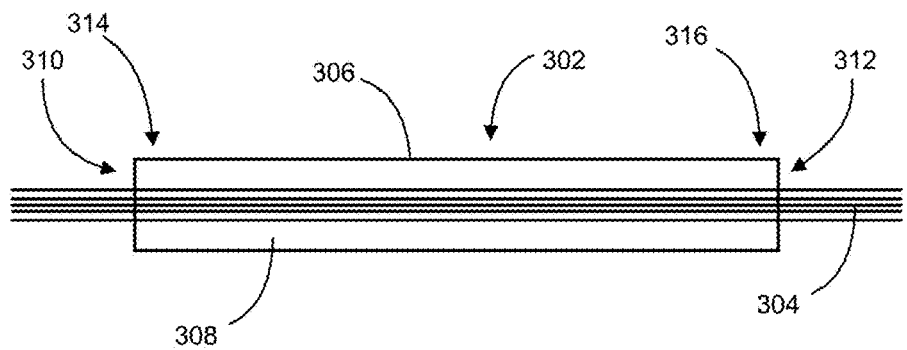
FIG. 3 illustrates an example of the flexible thermally-conductive shunt at stage 202 of the example procedure of FIG. 2, according to various embodiments.
Figure 4:
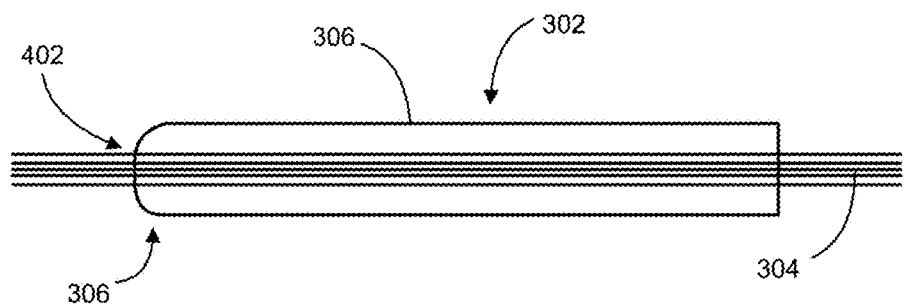
FIG. 4 illustrates an example of the flexible thermally-conductive shunt at stage 204 of the example procedure of FIG. 2, according to various embodiments.
Figure 5:
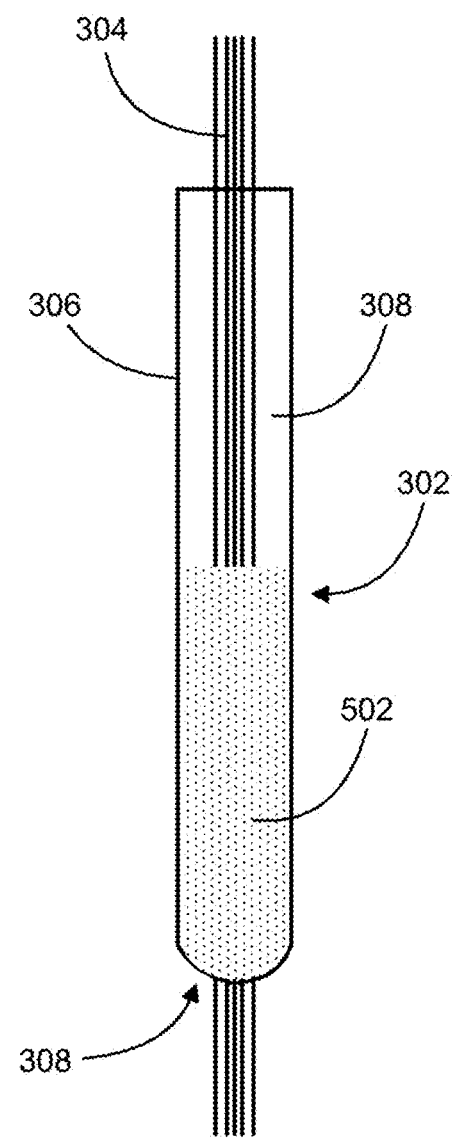
FIG. 5 illustrates an example of the flexible thermally-conductive shunt at stage 206 of the example procedure of FIG. 2, according to various embodiments.
Figure 6:
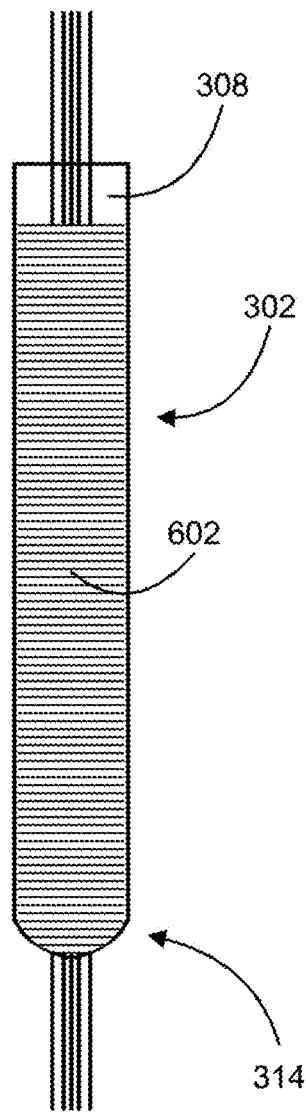
FIG. 6 illustrates an example of the flexible thermally-conductive shunt at stage 208 of the example procedure of FIG. 2, according to various embodiments.
Figure 7:
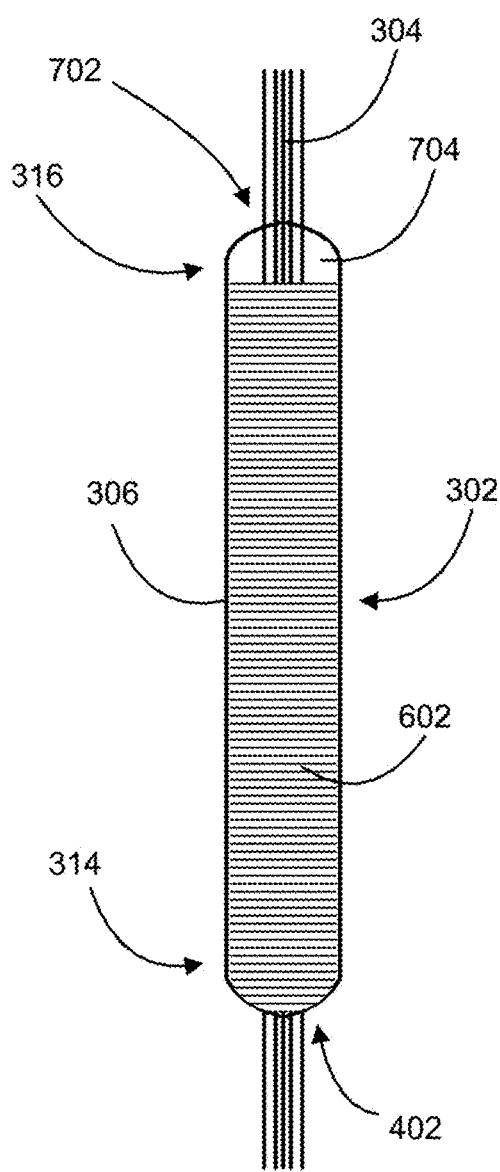
FIG. 7 illustrates an example of the flexible thermally-conductive shunt at stage 210 of the example procedure of FIG. 2, according to various embodiments.

The flexible thermally-conductive shunt 900 may include a thermally-conductive member 902 and a thermally-conductive element 904. The thermally-conductive member 902 may include one or more of the features of the thermally-conductive member 102 (FIG. 1) and/or the thermally-conductive member 302 (FIG. 3), and the thermally-conductive element 904 may include one or more of the features of the thermally-conductive element 104 (FIG. 1) and/or the thermally-conductive element 304 (FIG. 3). A first portion 906 of the thermally-conductive element 904 may extend from one end of the thermally-conductive member 902 and a second portion 908 of the thermally-conductive element 904 may extend from an opposite end of the thermally-conductive member 902.

The first portion 906 of the thermally-conductive element 904 may be coupled to a first cold block 910 and the second portion 908 may be coupled to a second cold block 912. The first portion 906 and the second portion 908 may be coupled to the first cold block 910 and the second cold block 912, respectively, via brazed metal, solder, epoxy, or some combination thereof. In some embodiments, the first cold block 910 and the second cold block 912 may be formed onto the first portion 906 and the second portion 908, respectively, such that the first cold block 910 becomes coupled to the first portion 906 during formation of the first cold block 910 and the second cold block 912 becomes coupled to the second portion 908 during formation of the second cold block 912. The first cold block 910 and the second cold block 912 may be thermally coupled via the thermally-conductive member 902 and the thermally-conductive element 904, such that heat may be transferred between the first cold block 910 and the second cold block 912 via the thermally-conductive member 902 and the thermally-conductive element 904.

When installed in an electrical system, one of the first cold block 910 and the second cold block 912 may be coupled to a heat-generating component and the other of the first cold block 910 and the second cold block 912 may be coupled to a coolant system, such as a liquid coolant system. Heat may be transferred from the heat-generating component to the coolant system via the flexible thermally-conductive shunt 900. In some embodiments, the first portion 906 and/or the second portion 908 may be coupled directly to the heat-generating component and/or the coolant system. Further, in some embodiments, the first portion 906 and/or the second portion 908 may be coupled to heat transfer pucks, cold plates, heat sinks, or some combination thereof.

Figure 10:
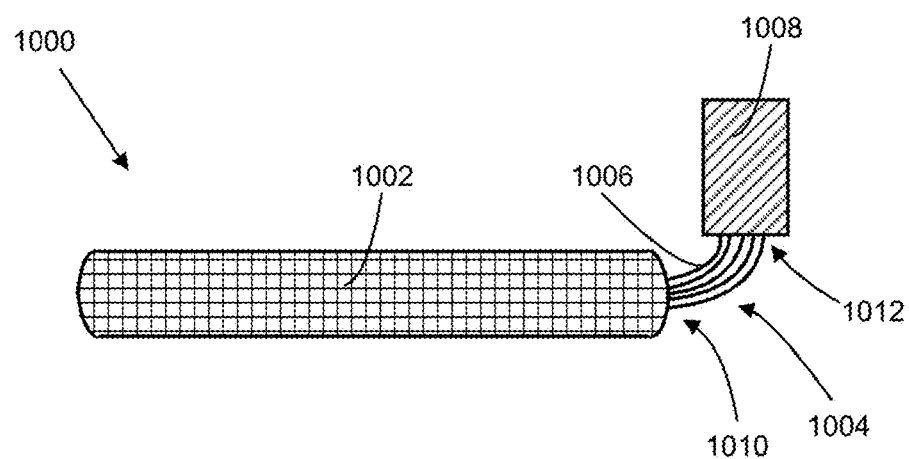
FIG. 10 illustrates an example flexible thermally-conductive shunt with flexed thermally-conductive element, according to various embodiments.

FIG. 10 illustrates an example flexible thermally-conductive shunt 1000 with a flexed thermally-conductive element 1004, according to various embodiments. The flexible thermally-conductive shunt 1000 may include one or more of the features of the flexible thermally-conductive shunt 100 (FIG. 1), the flexible thermally-conductive shunt produced by the procedure 200 (FIG. 2), the flexible thermally-conductive shunt 900 (FIG. 9), or some combination thereof. The flexible thermally-conductive shunt 1000 may include a thermally-conductive member 1002 and the thermally-conductive element 1004. The thermally-conductive member 1002 may include one or more of the features of the thermally-conductive member 102 (FIG. 1), the thermally-conductive member 302 (FIG. 3), the thermally-conductive member 902 (FIG. 9), or some combination thereof. The thermally-conductive element 1004 may include one or more of the features of the thermally-conductive element 104 (FIG. 1), the thermally-conductive element 304 (FIG. 3), the thermally-conductive element 904 (FIG. 9), or some combination thereof.

A portion 1006 of the thermally-conductive element 1004 may extend from an end of the thermally-conductive member 1002. The portion 1006 may be coupled to cold block 1008. The portion 1006 may be coupled to the cold block 1008 via brazed metal, solder, epoxy, or some combination thereof. As illustrated, the portion 1006 is flexed due to the position of the cold block 1008 relative to the thermally-conductive member 1002. As the position of the cold block 1008 relative to the thermally-conductive member 1002 is altered, the portion 1006 of the thermally-conductive element 1004 may flex in response to the altered position, while the thermally-conductive member 1002 and/or the cold block 1008 remain rigid. The flexing of the portion 1006 of the thermally-conductive element 1004 may prevent forces being applied to the thermally-conductive member 1002 and/or the cold block 1008 due to the altered position that may damage the thermally-conductive member 1002 and/or the cold block 1008.

In some embodiments, the cold block 1008 may be located at an angle from a discontinuity 1010 formed in the thermally-conductive member 1002. The discontinuity may include one or more of the features of the discontinuity 402 (FIG. 4), the discontinuity 702 (FIG. 7), or some combination thereof. The thermally-conductive element 1004 may extend from the discontinuity 1010 to a location 1012 that the thermally-conductive element 1004 is thermally coupled to the cold block 1008. Due to the angle, the thermally-conductive element 1004 may extend from the discontinuity 1010 to the location 1012 in a flexed manner. In the illustrated embodiment of the flexible thermally-conductive shunt 1000, the discontinuity 1010 is at a 90-degree angle to the location 1012 and the thermally-conductive element 1004 is flexed (illustrated by the curve of the thermally-conductive element 1004) due to the angle. It is to be understood that, in other embodiments, the angle may be greater or less than the 90-degree angle illustrated. Further, in some embodiments, the discontinuity 1010 and the location 1012 may be located on different planes. In these embodiments, the thermally conductive element 1004 may be flexed based on the discontinuity 1010 location 1012 being located on different planes.

In some embodiments, the portion 1006 of the thermally-conductive element 1004 may have a natural shape, such as naturally being curved as illustrated. The natural shape may be selected based on the features of the thermally-conductive element 1004, such as the thermally-conductive element 1004 being wire, flexible metal, thermally-conductive ribbon, a straight wire, a braided wire, a wicked wire, a spiral wire, a twisted wire, or some combination thereof. In some embodiments, a certain braiding, spiraling, and/or twisting configuration may be applied to the wire or ribbon to achieve the natural shape.

The portion 1006 may resist being transitioned from the natural shape and may generate a force in response to the portion 1006 being transitioned from the natural shape. The amount of the force may be based on the braiding, spiraling, and/or twisting configuration applied to the wire or ribbon, or the rigidity of the metal or other material of which the thermally-conductive element 1004 is formed. The portion 1006 may apply the force to the thermally-conductive member 1002 and/or the cold block 1008 urging the thermally-conductive member 1002 and/or the cold block 1008 into positions corresponding the natural shape of the portion 1006. In some embodiments, the relative positions of the thermally-conductive member 1002 to the cold block 1008 may be selected to transition the portion 1006 from the natural shape, thereby causing a biasing force to be applied to the thermally-conductive member 1002 and/or the cold block 1008. The biasing force can cause the thermally-conductive member 1002 and/or the cold block 1002 to be pressed against a component or components of the electrical system. It is to be understood that the features related to the natural shape of the portion 1006 of the thermally-conductive element 1004 described may be embodied by any of the thermally-conductive elements described throughout this disclosure, including the thermally-conductive element 104 (FIG. 1), the thermally-conductive element 304 (FIG. 3), and the thermally-conductive element 904 (FIG. 9).

Figure 11:
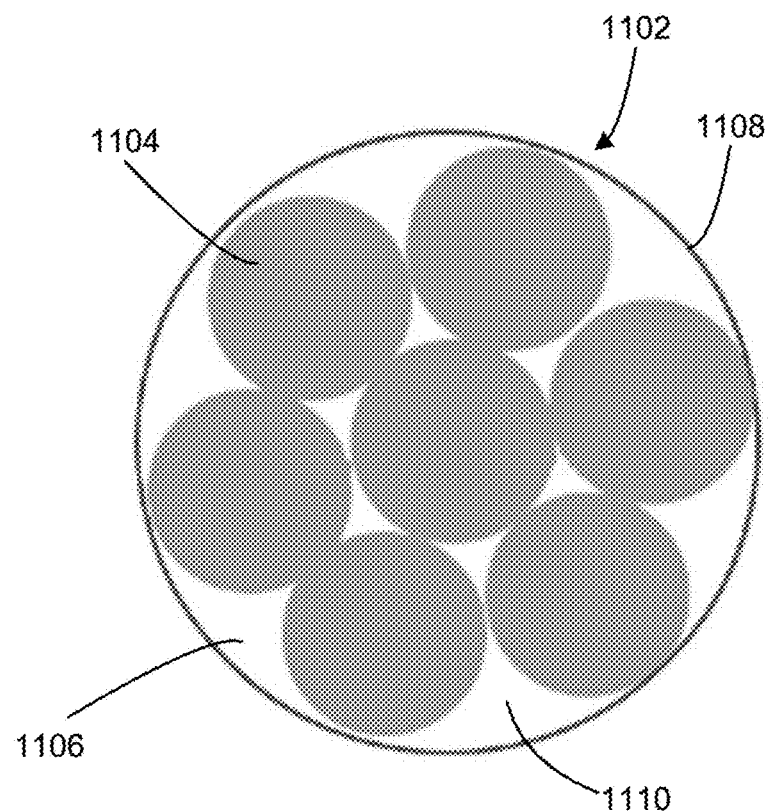
FIG. 11 illustrates a cross-sectional view of an example flexible thermally-conductive shunt, according to various embodiments.

FIG. 11 illustrates a cross-sectional view of an example flexible thermally-conductive shunt, according to various embodiments. The cross-sectional view may be of a cross-section of a thermally-conductive member 1102 with a thermally-conductive element 1104 extending through a cavity 1106 of the thermally-conductive member 1102. The thermally-conductive member 1102 may include one or more of the features of the thermally-conductive member 102 (FIG. 1), the thermally-conductive member 302 (FIG. 3), the thermally-conductive member 902 (FIG. 9), the thermally-conductive member 1002 (FIG. 10), or some combination thereof. The thermally-conductive element 1104 may include one or more of the features of the thermally-conductive element 104 (FIG. 1), the thermally-conductive element 304 (FIG. 3), the thermally-conductive element 904 (FIG. 9), the thermally-conductive element 1004 (FIG. 10), or some combination thereof. In some embodiments, the thermally-conductive member 1102 may be a heat pipe.

The thermally-conductive member 1102 may include a shell 1108 that encloses the cavity 1106. In some embodiments, the In the illustrated embodiment, the thermally-conductive element 1104 may include seven wires that extending through the cavity 1106. Voids 1110 may exist in the cavity 1106 among the wires. In embodiments that include liquid (such as the liquid 602), gas, or some combination thereof, the liquid and/or gas may at least partially fill the voids 1110. In other embodiments, the thermally-conductive element 1104 may include a different number of wires, a piece of flexible metal, thermally-conductive ribbon, or some combination thereof. It is to be understood that the illustrated cross-sectional view illustrates some embodiments, whereas the other embodiments may appear differently than the cross-sectional view illustrated.

Figure 12:
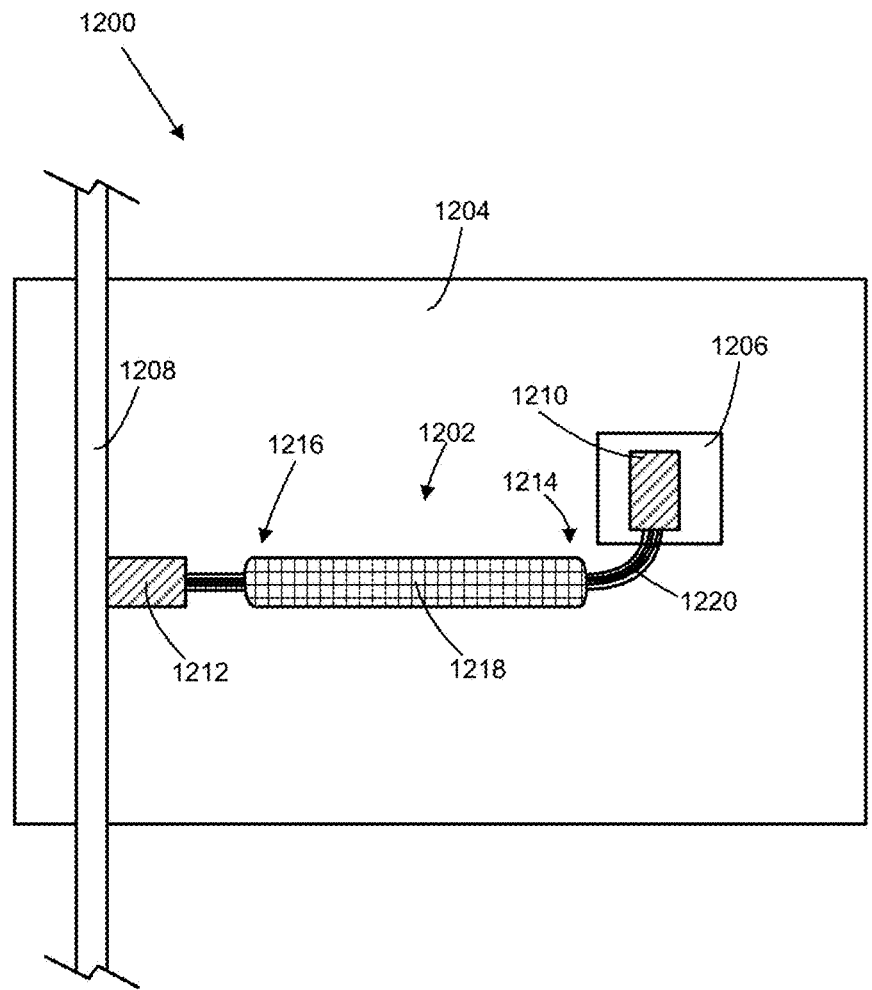
FIG. 12 illustrates an example electrical system with a flexible thermally-conductive shunt, according to various embodiments.

FIG. 12 illustrates an example electrical system 1200 with a flexible thermally-conductive shunt 1202, according to various embodiments. The flexible thermally-conductive shunt 1202 may include one or more of the features of the flexible thermally-conductive shunt 100 (FIG. 1), the flexible thermally-conductive shunt produced by the procedure 200 (FIG. 2), the flexible thermally-conductive shunt 900 (FIG. 9), the flexible thermally-conductive shunt 1000 (FIG. 10), or some combination thereof.

The electrical system 1200 may include a mounting element 1204 with one or more components 1206 mounted to the mounting element 1204. The mounting element 1204 may be a circuit board and the components 1206 may be electrical elements, including, but not limited to, resistors, capacitors, transformers, processors, transistors, integrated circuits, or some combination thereof. The components 1206 may generate heat during operation and/or when power is applied to the components 1206.

The electrical system 1200 may further include a coolant system, where a coolant tube 1208 of the coolant system is illustrated. The coolant system may include a liquid coolant system, a vapor coolant system, or some combination thereof. The coolant system may cause liquid and/or vapor to the circulated through the coolant tube 1208, the liquid and/or vapor to carry heat from the coolant tube 1208 to a heat exchanger, fan, air conditioner, or other coolant element that dissipates the heat.

The flexible thermally-conductive shunt 1202 may be thermally coupled to the component 1206 at a first end 1214 via a first cold block 1210 and to the coolant tube 1208 at a second end 1216 via a second cold block 1212. The first cold block 1210 and the second cold block 1212 may include one or more of the features of the first cold block 910 (FIG. 9), the second cold block 912 (FIG. 9), the cold block 1008 (FIG. 10), or some combination thereof.

As the component 1206 generates heat, the flexible thermally-conductive shunt 1202 may receive the heat via the first cold block 1210 and transfer the heat to the coolant tube 1208 via the second cold block 1212. In particular, the heat may be received at the first end 1214 and be transferred to the second end 1216, where the heat is applied to the coolant tube 1208. In embodiments where liquid and/or gas is located within the thermally-conductive member 1218 of the flexible thermally-conductive shunt 1202, the application of heat to the first end 1214 may cause the liquid and/or gas to move within the thermally-conductive member 1218 and may quicken transfer of heat to the second end 1216. Further, in some embodiments, the application of heat may cause the liquid to vaporize, which may quicken the transfer of heat to the second end 1216.

In some embodiments of the electrical system 1200, the position of the component 1206 relative to the coolant tube 1208 may be non-uniform due to inconsistencies in features of the coolant system and/or the component 1206, the coolant tube 1208 and/or the component 1206 may vibrate during operation or movement, or some combination thereof. In these embodiments, portions of a thermally-conductive element 1220 may flex to compensate for the inconsistencies and/or vibrations, thereby isolating rigid elements (such as the thermally-conductive member 1218, the coolant tube 1208 and/or component 1206) of the electrical system 1200 from forces generated by the inconsistencies and/or vibrations that could cause damage to the rigid elements. Legacy electrical systems often failed to compensate for these inconsistencies and/or vibrations, which resulted to the forces generated by the inconsistencies and/or vibrations being applied to the rigid elements and often causing damage to the rigid elements.

Figure 13:
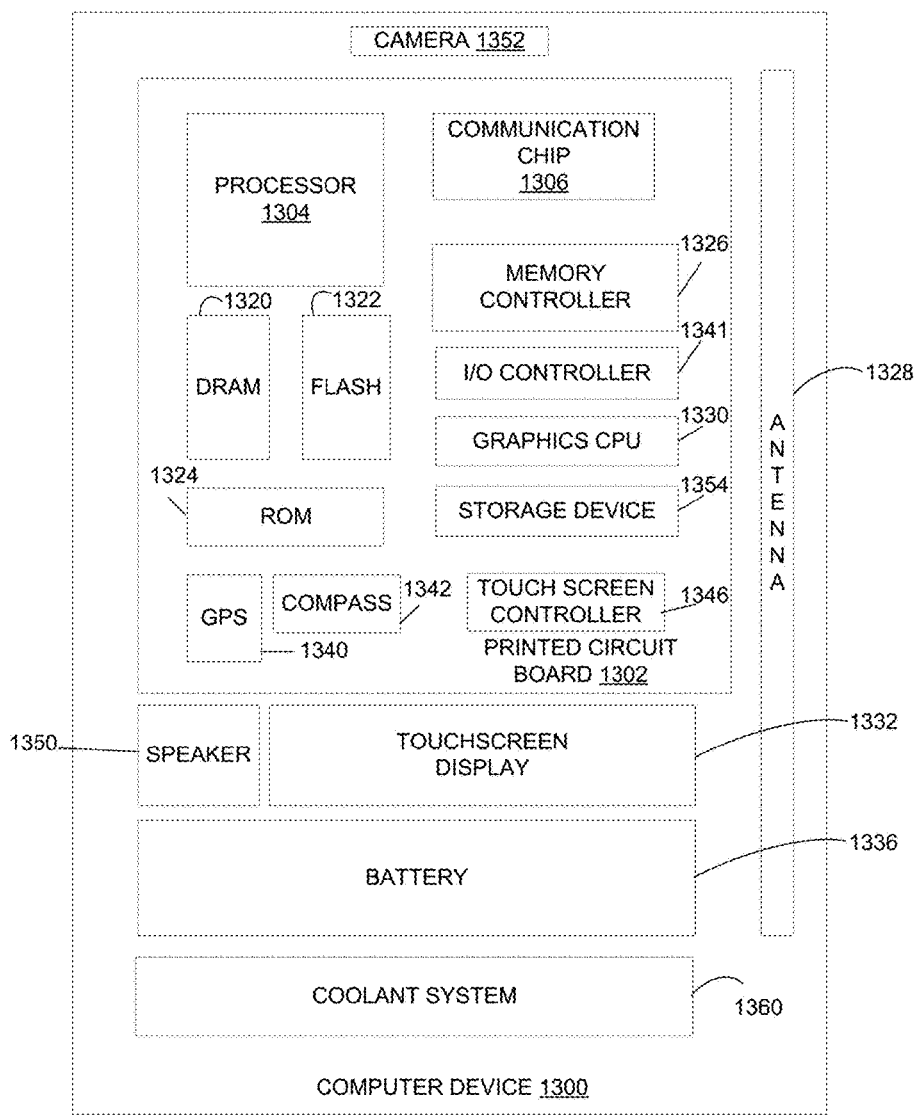
FIG. 13 illustrates an example computing device that may employ the apparatuses and/or methods described herein.

FIG. 13 illustrates an example computer device 1300 that may employ one or more of the apparatuses and/or methods described herein (e.g., the flexible thermally-conductive shunt 100, the procedure 200, the flexible thermally-conductive shunt 900, the flexible thermally-conductive shunt 1000, the electrical system 1200, and/or the flexible thermally-conductive shunt 1202), in accordance with various embodiments. As shown, computer device 1300 may include a number of components, such as one or more processor(s) 1304 (one shown) and at least one communication chip 1306. In various embodiments, the one or more processor(s) 1304 each may include one or more processor cores. In various embodiments, the at least one communication chip 1306 may be physically and electrically coupled to the one or more processor(s) 1304. In further implementations, the communication chip 1306 may be part of the one or more processor(s) 1304. In various embodiments, computer device 1300 may include printed circuit board (PCB) 1302. For these embodiments, the one or more processor(s) 1304 and communication chip 1306 may be disposed thereon. In alternate embodiments, the various components may be coupled without the employment of PCB 1302.

Depending on its applications, computer device 1300 may include other components that may or may not be physically and electrically coupled to the PCB 1302. These other components include, but are not limited to, memory controller 1326, volatile memory (e.g., dynamic random access memory (DRAM) 1320), non-volatile memory such as read only memory (ROM) 1324, flash memory 1322, storage device 1354 (e.g., a hard-disk drive (HDD)), an I/O controller 1341, a digital signal processor (not shown), a crypto processor (not shown), a graphics processor 1330, one or more antenna 1328, a display (not shown), a touch screen display 1332, a touch screen controller 1346, a battery 1336, an audio codec (not shown), a video codec (not shown), a global positioning system (GPS) device 1340, a compass 1342, an accelerometer (not shown), a gyroscope (not shown), a speaker 1350, a camera 1352, and a mass storage device (such as hard disk drive, a solid state drive, compact disk (CD), digital versatile disk (DVD)) (not shown), and so forth.

The computer device 1300 may include a coolant system 1360, which may include one or more coolant tubes routed within the computer device 1300. The coolant system 1360 may include one or more of the features of the coolant system described in relation to FIG. 12 and the one or more coolant tubes may include one or more features of the coolant tube 1208 (FIG. 11). One or more flexible thermally-conductive shunts (such as the flexible thermally-conductive shunt 100, the procedure 200, the flexible thermally-conductive shunt 900, the flexible thermally-conductive shunt 1000, the electrical system 1200, and/or the flexible thermally-conductive shunt 1202) may couple one or more of the components of the computer device 1300 to the coolant system 1360, the one or more coolant tubes, or some combination thereof. In some embodiments, the coolant system 1360 may be located outside the computer device 1300 and the one or more coolant tubes may be routed into the computer device 1300.

In some embodiments, the one or more processor(s) 1304, flash memory 1322, and/or storage device 1354 may include associated firmware (not shown) storing programming instructions configured to enable computer device 1300, in response to execution of the programming instructions by one or more processor(s) 1304, to practice all or selected aspects of the methods described herein. In various embodiments, these aspects may additionally or alternatively be implemented using hardware separate from the one or more processor(s) 1304, flash memory 1322, or storage device 1354.

The communication chips 1306 may enable wired and/or wireless communications for the transfer of data to and from the computer device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to IEEE 902.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 1300 may include a plurality of communication chips 1306. For instance, a first communication chip 1306 may be dedicated to shorter range wireless communications such as Wi-Fi and Bluetooth, and a second communication chip 1306 may be dedicated to longer range wireless communications such as GPS, EDGE, GPRS, CDMA, WiMAX, LTE, Ev-DO, and others.

In various implementations, the computer device 1300 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 1300 may be any other electronic device that processes data.

Example 1 may include a thermally-conductive apparatus, comprising a flexible thermally-conductive element, and a thermally-conductive member, thermally coupled to the flexible thermally-conductive element, including a shell sealed to the flexible thermally-conductive element, wherein the flexible thermally-conductive element extends through a discontinuity of the shell, and a cavity formed at a center of the thermally-conductive member and enclosed by the shell, wherein a first portion of the flexible thermally-conductive element extends within the cavity and a second portion of the flexible thermally-conductive element extends out of the thermally-conductive member via the discontinuity of the shell.

Example 2 may include the thermally-conductive apparatus of example 1, wherein the flexible thermally-conductive element includes thermally-conductive one or more wires.

Example 3 may include the thermally-conductive apparatus of example 2, wherein the one or more wires are braided.

Example 4 may include the thermally-conductive apparatus of example 2, further comprising an insulator encircling the second portion of the one or more wires for at least a part of the length of the one or more wires.

Example 5 may include the thermally-conductive apparatus of any of the examples 1-4, wherein the flexible thermally-conductive element is a thermally-conductive ribbon or a flexible, thermally-conductive metal.

Example 6 may include the thermally-conductive apparatus of any of the examples 1-4, wherein the first portion of the flexible thermally-conductive element located within the cavity is sintered and the second portion of the flexible thermally-conductive element that extends out of the thermally-conductive member is not sintered.

Example 7 may include the thermally-conductive apparatus of any of the examples 1-4, wherein the thermally-conductive member is a heat pipe with sealed ends.

Example 8 may include the thermally-conductive apparatus of example 7, wherein the discontinuity is a first sealed end of the sealed ends of the heat pipe.

Example 9 may include the thermally-conductive apparatus of example 8, wherein a third portion of the flexible thermally-conductive element extends out of the heat pipe through a second discontinuity of the shell, the second discontinuity being a second sealed end of the sealed ends, the third portion of the flexible thermally-conductive element being attached to an opposite end of the first portion of the flexible thermally-conductive element from the second portion of the flexible thermally-conductive element.

Example 10 may include the thermally-conductive apparatus of example 9, further comprising a first cold block, wherein the second portion of the flexible thermally-conductive element that extends out of the heat pipe is thermally coupled to the first cold block and a second cold block, wherein the third portion of the flexible thermally-conductive element that extends out of the heat pipe is thermally coupled to the second cold block, and wherein the flexible thermally-conductive element is to conduct heat between the first cold block and the second cold block.

Example 11 may include the thermally-conductive apparatus of example 10, further comprising a heat-generating component thermally coupled to the first cold block, and a coolant system thermally coupled to the second cold block, wherein heat is transferred between the heat-generating component and the coolant system via the first cold block, the second cold block, and the flexible thermally-conductive element.

Example 12 may include the thermally-conductive apparatus of example 10, further comprising a circuit board, a processor mounted to the circuit board, wherein the first cold block is thermally coupled to the processor or a heat-generating component mounted to the circuit board, and a coolant system thermally coupled to the second cold block, wherein heat is transferred between processor or the heat-generating component and the coolant system via the first cold block, the second cold block, and the flexible thermally-conductive element.

Example 13 may include the thermally-conductive apparatus of any of the examples 1-4, further comprising a cold block, wherein the second portion of the flexible thermally-conductive element that extends out of the thermally-conductive member is thermally coupled to the cold block, the cold block to conduct heat from the thermally-conductive member to a coolant system via the flexible thermally-conductive element.

Example 14 may include the thermally-conductive apparatus of example 13, wherein the discontinuity of the shell is located at an angle to a location that the flexible thermally-conductive element is thermally coupled to the cold block, and wherein the flexible thermally-conductive element extends between the discontinuity of the shell and the location in a flexed manner.

Example 15 may include the thermally-conductive apparatus of example 13, wherein the discontinuity of the shell and a location that the flexible thermally-conductive element is thermally coupled to the cold block are located on different planes, and wherein the flexible thermally-conductive element is flexed based on the discontinuity of the shell and the location being located on the different planes.

Example 16 may include the thermally-conductive apparatus of any of the examples 1-4, further comprising thermally-conductive liquid located within the cavity of the thermally-conductive member.

Example 17 may include the thermally-conductive apparatus of any of the examples 1-4, wherein the shell is sealed about the flexible thermally-conductive element via solder.

Example 18 may include the thermally-conductive apparatus of any of the examples 1-4, wherein the second portion of the flexible thermally-conductive element is formed with an initial shape and provides resistance in response to being flexed from the initial shape.

Example 19 may include the thermally-conductive apparatus of any of the examples 1-4, wherein the flexible thermally-conductive element is a first flexible thermally-conductive element, and wherein the thermally-conductive apparatus further comprises a second flexible thermally-conductive element coupled to an outer surface of the shell and that extends along the first flexible thermally-conductive element.

Example 20 may include the thermally-conductive apparatus of example 19, wherein the first flexible thermally-conductive element includes a first set of wires and the second flexible thermally-conductive element includes a second set of wires, and wherein the first set of wires and the second set of wires are braided together.

Example 21 may include a method of producing a thermally-conductive apparatus, comprising positioning a thermally-conductive member relative to a flexible thermally-conductive element, the thermally-conductive member having a first opening at a first end of the thermally-conductive member and a second opening at second end of the thermally-conductive member, sealing the first opening to the flexible thermally-conductive element with the flexible thermally-conductive element affixed in the sealed first opening of the thermally-conductive member, wherein a first portion of the flexible thermally-conductive element extends within the thermally-conductive member and a second portion of the flexible thermally-conductive element extends outside the thermally-conductive member, and sealing the second opening, sealing the second opening causing a cavity to be enclosed within the thermally-conductive member between the first end and the second end.

Example 22 may include the method of example 21, wherein sealing the first opening includes swaging the thermally-conductive member at the first opening, wherein the first end of the thermally-conductive member is sealed against the flexible thermally-conductive element.

Example 23 may include the method of any of the examples 21 and 22, wherein sealing the first opening includes brazing the thermally-conductive member to the flexible thermally-conductive element at the first end of the thermally-conductive member.

Example 24 may include the method of any of the examples 21 and 22, further comprising sintering the first portion of the flexible thermally-conductive element that extends within the thermally-conductive member.

Example 25 may include the method of example 24, wherein sintering the first portion of the flexible thermally-conductive element is performed after sealing the first opening and prior to sealing the second opening.

Example 26 may include the method of any of the examples 21 and 22, further comprising at least partially filling the cavity with a thermally-conductive liquid.

Example 27 may include the method of example 26, wherein at least partially filling the cavity with the thermally-conductive liquid is performed after sealing the first opening and prior to sealing the second opening.

Example 28 may include the method of any of the examples 21 and 22, wherein the flexible thermally-conductive element includes thermally-conductive one or more wires, a thermally-conductive ribbon, or a flexible, thermally-conductive metal.

Example 29 may include the method of example 28, wherein the flexible thermally-conductive element includes the one or more wires, and wherein the one or more wires are braided.

Example 30 may include the method of any of the examples 21 and 22, wherein the thermally-conductive member is a heat pipe, wherein the heat pipe is cylindrical prior to sealing the first opening and sealing the second opening.

Example 31 may include the method of example 30, further comprising compressing at least a portion of the heat pipe to at least partially flatten at least the portion of the heat pipe.

Example 32 may include the method of any of the examples 21 and 22, further comprising thermally coupling a cold block to the second portion of the flexible thermally-conductive element, the cold block to conduct heat from the thermally-conductive member to a coolant system via the flexible thermally-conductive element.

Example 33 may include the method of any of the examples 21 and 22, wherein the first opening is sealed about a first cross-section of the flexible thermally-conductive element located between the first portion and the second portion, wherein sealing the second opening includes sealing the second opening about a second cross-section of the flexible thermally-conductive element, the second cross-section located between the first portion and a third portion of the thermally-conductive member, the third portion located at an opposite end of the first portion from the second portion and that extends out of the thermally-conductive member from the sealed second opening.

Example 34 may include the method of example 33, further comprising thermally coupling a first cold block to the second portion of the flexible thermally-conductive element, and thermally coupling a second cold block to the third portion of the flexible thermally-conductive element, wherein the flexible thermally-conductive element is to conduct heat between the first cold block and the second block.

Example 35 may include the method of example 34, further comprising thermally coupling the first cold block to a heat-generating component, and thermally coupling the second cold block to a coolant system, wherein heat is to be transferred from the heat-generating component to the coolant system via the first cold block, the second cold block, and the flexible thermally-conductive element.

Example 36 may include the method of example 35, wherein the heat-generating component is a processor mounted to a circuit board.

Example 37 may include a thermally-conductive apparatus, comprising a flexible means for transfer of heat to a means to dissipate heat, a means to encapsulate a first portion of the flexible means, wherein the means to encapsulate is thermally coupled to the flexible means, wherein the means to encapsulate includes a shell with a discontinuity sealed to the flexible means, and wherein the first portion of the flexible means is encapsulated within a cavity formed within the means to encapsulate and a second portion extends out of the means to encapsulate via the discontinuity.

Example 38 may include the thermally-conductive apparatus of example 39, wherein the flexible means includes thermally-conductive one or more wires.

Example 39 may include the thermally-conductive apparatus of example 38, wherein the one or more wires are braided.

Example 40 may include the thermally-conductive apparatus of example 38, further comprising a means to insulate that encircles the second portion of the one or more wires for at least a part of the length of the one or more wires.

Example 41 may include the thermally-conductive apparatus of any of the examples 37-40, wherein the flexible means is a thermally-conductive ribbon or a flexible, thermally-conductive metal.

Example 42 may include the thermally-conductive apparatus of any of the examples 37-40, wherein the first portion of the flexible means is sintered and the second portion of the flexible means is not sintered.

Example 43 may include the thermally-conductive apparatus of any of the examples 37-40, wherein the means to encapsulate is a heat pipe with sealed ends.

Example 44 may include the thermally-conductive apparatus of example 43, wherein the discontinuity is a first sealed end of the sealed ends of the heat pipe.

Example 45 may include the thermally-conductive apparatus of example 44, wherein a third portion of the flexible means extends out of the heat pipe through a second discontinuity of the shell, the second discontinuity being a second sealed end of the sealed ends, the third portion of the flexible means being attached to an opposite end of the first portion of the flexible means from the second portion of the flexible means.

Example 46 may include the thermally-conductive apparatus of example 45, further comprising a means to thermally couple the flexible means to the means to dissipate heat, wherein the second portion of the flexible means is thermally coupled to the means to thermally couple the flexible means to the means to dissipate heat, and a means to thermally couple the flexible means to a component, wherein the third portion of the flexible means is thermally coupled to the means to thermally couple the flexible means to the component, wherein the flexible means is to conduct heat between the means to thermally couple the flexible means to the means to dissipate heat and the means to thermally couple the flexible means to the component.

Example 47 may include the thermally-conductive apparatus of example 46, further comprising the component thermally coupled to the means to thermally couple the flexible means to the component, the component being a heat-generating component, and the means to dissipate heat thermally coupled to the means to thermally couple the flexible means to the means to dissipate heat, wherein heat is transferred between the heat-generating component and the means to dissipate heat via the means to thermally couple the flexible means to the means to dissipate heat, the means to thermally couple the flexible means to the component, and the flexible means.

Example 48 may include the thermally-conductive apparatus of example 46, further comprising a circuit board, a processor mounted to the circuit board, wherein the means to thermally couple the flexible means to the component is thermally coupled to the processor or a heat-generating component mounted to the circuit board, and the means to dissipate heat thermally coupled to the means to thermally couple the flexible means to the means to dissipate heat, wherein heat is transferred between processor or the heat-generating component and the means to dissipate heat via the means to thermally couple the flexible means to the component, the means to thermally couple the flexible means to the means to dissipate heat, and the flexible means.

Example 49 may include the thermally-conductive apparatus of any of the examples 37-40, further comprising a means to thermally couple the flexible means to the means to dissipate heat, wherein the second portion of the flexible means is thermally coupled to the means to thermally couple the flexible means to the means to dissipate heat, the means to thermally couple the flexible means to the means to dissipate heat is to conduct heat from the means to encapsulate the first portion of the flexible means to the means to dissipate heat via the flexible means.

Example 50 may include the thermally-conductive apparatus of example 49, wherein the discontinuity of the shell is located at an angle to a location that the flexible means is thermally coupled to the means to thermally couple the flexible means to the means to dissipate heat, and wherein the flexible means extends between the discontinuity of the shell and the location in a flexed manner.

Example 51 may include the thermally-conductive apparatus of example 49, wherein the discontinuity of the shell and a location that the flexible means is thermally coupled to the means to thermally couple the flexible means to the means to dissipate heat are located on different planes, and wherein the flexible means is flexed based on the discontinuity of the shell and the location being located on different planes.

Example 52 may include the thermally-conductive apparatus of any of the examples 37-40, further comprising thermally-conductive liquid located within the cavity of the means to encapsulate the first portion of the flexible means.

Example 53 may include the thermally-conductive apparatus of any of the examples 37-40, wherein the shell is sealed about the flexible means via solder.

Example 54 may include the thermally-conductive apparatus of any of the examples 37-40, wherein the second portion of the flexible means is formed with an initial shape and provides resistance in response to being flexed from the initial shape.

Example 55 may include the thermally-conductive apparatus of any of the examples 37-40, wherein the flexible means is a first flexible means, and wherein the thermally-conductive apparatus further comprises a second flexible means for transfer of heat to the means to dissipate heat coupled to an outer surface of the shell and that extends along the first flexible means.

Example 56 may include the thermally-conductive apparatus of example 55, wherein the first flexible means includes a first set of wires and the second flexible means includes a second set of wires, and wherein the first set of wires and the second set of wires are braided together.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:
1. A thermally-conductive apparatus, comprising:
 a flexible thermally-conductive element; and
 a thermally-conductive member, thermally coupled to the
  flexible thermally-conductive element, including:

a shell sealed to the flexible thermally-conductive element, wherein the flexible thermally-conductive element extends through a discontinuity of the shell; and a cavity formed at a center of the thermally-conductive member and enclosed by the shell, wherein a first portion of the flexible thermally-conductive element extends within the cavity and a second portion of the flexible thermally-conductive element extends out of the thermally-conductive member via the discontinuity of the shell, and wherein the first portion of the flexible thermally-conductive element located within the cavity is sintered and the second portion of the flexible thermally-conductive element that extends out of the thermally-conductive member is not sintered.

2. The thermally-conductive apparatus of claim 1, wherein the flexible thermally-conductive element includes thermally-conductive one or more wires.

3. The thermally-conductive apparatus of claim 1, wherein the flexible thermally-conductive element is a thermally-conductive ribbon or a flexible, thermally-conductive metal.

4. The thermally-conductive apparatus of claim 1, wherein the thermally-conductive member is a heat pipe with sealed ends.

5. The thermally-conductive apparatus of claim 4, wherein the discontinuity is a first sealed end of the sealed ends of the heat pipe.

6. The thermally-conductive apparatus of claim 1, further comprising a cold block, wherein the second portion of the flexible thermally-conductive element that extends out of the thermally-conductive member is thermally coupled to the cold block, the cold block to conduct heat from the thermally-conductive member to a coolant system via the flexible thermally-conductive element.

7. The thermally-conductive apparatus of claim 6, wherein the discontinuity of the shell is located at an angle to a location that the flexible thermally-conductive element is thermally coupled to the cold block, and wherein the flexible thermally-conductive element extends between the discontinuity of the shell and the location in a flexed manner.

8. A thermally-conductive apparatus, comprising:
a flexible thermally-conductive element; and
a thermally-conductive member, thermally coupled to the flexible thermally-conductive element, wherein the thermally-conductive member is a heat pipe with sealed ends, and wherein the thermally-conductive member includes:
a shell sealed to the flexible thermally-conductive element, wherein the flexible thermally-conductive element extends through a discontinuity of the shell, and wherein the discontinuity is a first sealed end of the sealed ends of the heat pipe; and
a cavity formed at a center of the thermally-conductive member and enclosed by the shell, wherein a first portion of the flexible thermally-conductive element extends within the cavity and a second portion of the flexible thermally-conductive element extends out of the thermally-conductive member via the discontinuity of the shell, wherein a third portion of the flexible thermally-conductive element extends out of the heat pipe through a second discontinuity of the shell, the second discontinuity being a second sealed end of the sealed ends, the third portion of the flexible thermally-conductive element being attached to an opposite end of the first portion of the flexible thermally-conductive element from the second portion of the flexible thermally-conductive element
a first cold block, wherein the second portion of the flexible thermally-conductive element that extends out of the heat pipe is thermally coupled to the first cold block;
a second cold block, wherein the third portion of the flexible thermally-conductive element that extends out of the heat pipe is thermally coupled to the second cold block, and wherein the flexible thermally-conductive element is to conduct heat between the first cold block and the second cold block;
a heat-generating component thermally coupled to the first cold block; and
a coolant system thermally coupled to the second cold block, wherein heat is transferred between the heat-generating component and the coolant system via the first cold block, the second cold block, and the flexible thermally-conductive element.

9. The thermally-conductive apparatus of claim 8, further comprising:
a circuit board;
a processor mounted to the circuit board, wherein the first cold block is thermally coupled to the processor or a heat-generating component mounted to the circuit board; and
a coolant system thermally coupled to the second cold block, wherein heat is transferred between the processor or the heat-generating component and the coolant system via the first cold block, the second cold block, and the flexible thermally-conductive element.

10. The thermally-conductive apparatus of claim 9, further comprising thermally-conductive liquid enclosed within the thermally-conductive member.

11. The thermally-conductive apparatus of claim 8, further comprising thermally-conductive liquid enclosed within the thermally-conductive member.

* * * * *